United States Patent
Shieh et al.

(10) Patent No.: US 6,567,270 B2
(45) Date of Patent: May 20, 2003

(54) SEMICONDUCTOR CHIP PACKAGE WITH COOLING ARRANGEMENT

(75) Inventors: Wen-Lo Shieh, Taipei (TW); Ning Huang, Taipei (TW); Hui-Pin Chen, Taipei (TW); Hua-Wen Chiang, Taipei (TW); Chung-Ming Chang, Taipei (TW); Feng-Chang Tu, Taipei (TW); Fu-Yu Huang, Taipei (TW); Hsuan-Jui Chang, Taipei (TW); Chia-Chieh Hu, Taipei (TW); Wen-Long Leu, Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 09/988,094

(22) Filed: Nov. 19, 2001

(65) Prior Publication Data

US 2003/0035270 A1 Feb. 20, 2003

(30) Foreign Application Priority Data

Aug. 16, 2001 (TW) .......................... 90120335 A

(51) Int. Cl.⁷ ................................. H05K 7/20
(52) U.S. Cl. ................. 361/719; 165/185; 174/16.3; 257/710
(58) Field of Search ............... 174/16.3, 252; 165/80.3, 185; 257/707, 710, 713; 361/704, 705, 709–712, 717–719, 722

(56) References Cited

U.S. PATENT DOCUMENTS

| | | | | | |
|---|---|---|---|---|---|
| 5,241,451 A | * | 8/1993 | Walburn et al. | ............. | 361/785 |
| 5,730,210 A | * | 3/1998 | Kou | ............. | 165/80.3 |
| 5,883,782 A | * | 3/1999 | Thurston et al. | ............. | 361/704 |
| 5,901,039 A | * | 5/1999 | Dehaine et al. | ............. | 361/704 |
| 6,191,360 B1 | * | 2/2001 | Tao et al. | ............. | 174/52.4 |
| 6,385,048 B2 | * | 5/2002 | Mellberg et al. | ............. | 361/704 |

* cited by examiner

Primary Examiner—Gerald Tolin
(74) Attorney, Agent, or Firm—Leong C. Lei

(57) ABSTRACT

A semiconductor chip package with cooling arrangement includes a heat sink adapted for covering at least a semiconductor chip, characterized in that said heat sink has an inverted U-shaped cross section thereby forming a recess at an inner bottom thereof adapted for covering at least a semiconductor chip and a plurality of pins extending downwardly from a circumferential lower edge of said heat sink, each of said pins being formed with a neck, an enlarged head, and an open slot separating said neck and said enlarged head into two portions, whereby the package can rapidly remove heat from the semiconductor chip, filter noise and reduce inductance.

1 Claim, 3 Drawing Sheets

SEMICONDUCTOR CHIP PACKAGE WITH COOLING ARRANGEMENT

BACKGROUND OF THE INVENTION

1. Field of the Invention

This invention is related to a semiconductor chip package with cooling arrangement and in particular to one which can rapidly carry heat from the semiconductor chip, filter noise and reduce inductance during operation.

2. Description of the Prior Art

With the increase in the performance requirements for computers and other electronic equipments, the semiconductor operates at higher power. However, when a semiconductor is operated at a high temperature environment, its working efficiency and reliability will be greatly reduced thereby making it quite important to lower the working temperature of the semiconductor. As shown in FIG. 1, the conventional heat dissipation device for semiconductor chips is simply a heat sink 13' for covering a semiconductor chip 1' on a substrate 15'. Metal bumps 11' are arranged on the substrate 15' for supporting the semiconductor chip 1'. A thermal conductive bonding adhesive 12' is filled between the top of the semiconductor chip 1' and the bottom side of the heat sink 13'. The lower edge of the heat sink 13' is affixed to the substrate 15' by bonding adhesive. FIG. 2 illustrates another conventional heat dissipation device for semiconductor chips. As shown, the semiconductor chip 2' is first connected to the substrate 25' by golden wires 21', enclosed with epoxy resin 24', applying a layer of thermal conductive bonding adhesive 22' on the top of the epoxy resin 24', and then affix the heat sink 23' on the thermal conductive bonding adhesive 22'.

Nevertheless, the above-mentioned conventional heat dissipation devices are only designed for carrying heat for the semiconductor chip in operation to the heat sink for cooling by air and do not have any other purposes.

Therefore, it is an object of the present invention to provide a semiconductor chip package with cooling arrangement which has improved heat dissipation effect and can filter noise and reduce inductance.

SUMMARY OF THE INVENTION

This invention is related to a semiconductor chip package with cooling arrangement and in particular to one which can rapidly carry heat from the semiconductor chip during operation.

It is the primary object of the present invention to provide a semiconductor chip package with cooling arrangement which can keep the distance between the heat sink and the semiconductor chip or package.

It is another object of the present invention to provide a semiconductor chip package with cooling arrangement which has a heat sink connected to the ground.

It is still another object of the present invention to provide a semiconductor chip package with cooling arrangement which can filter noise and reduce inductance.

It is still another object of the present invention to provide a semiconductor chip package with cooling arrangement which can strengthen the structure of the semiconductor chip package.

It is a further object of the present invention to provide a semiconductor chip package with cooling arrangement which can simply the assembly of the cooling arrangement and the substrate.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PRESENT INVENTION

Figure 1:
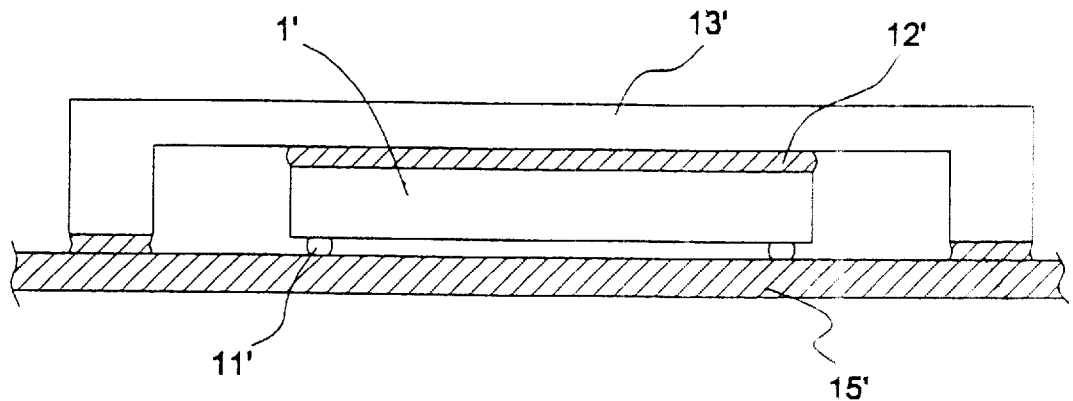
FIG. 1 illustrates a first prior art heat dissipation device for a semiconductor chip.
Figure 2:
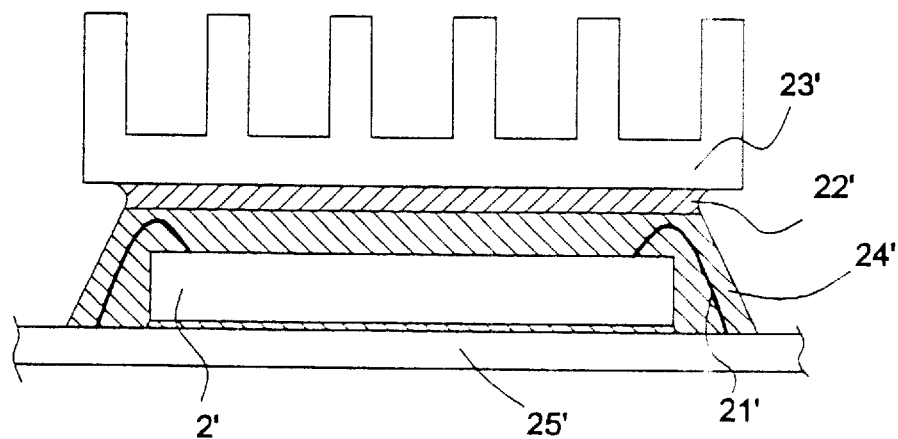
FIG. 2 illustrate a second prior art heat dissipation device for a semiconductor chips.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, alterations and further modifications in the illustrated device, and further applications of the principles of the invention as illustrated herein being contemplated as would normally occur to one skilled in the art to which the invention relates.

Figure 3A:
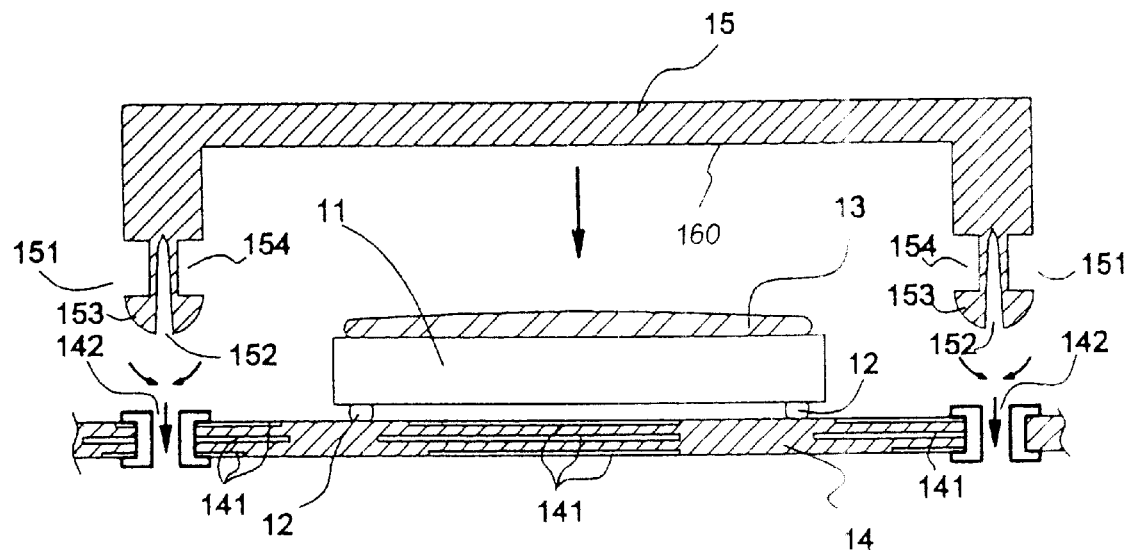
FIG. 3A is an exploded view of the present invention.
Figure 3B:
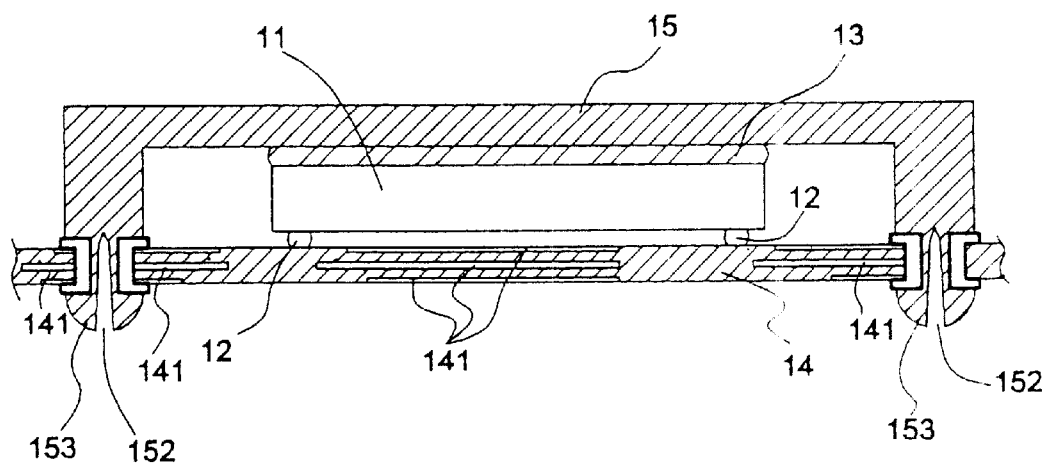
FIG. 3B is an assembled view of the present invention.

With reference to the drawings and in particular to FIGS. 3A and 3B thereof, the present invention generally comprises a heat sink 15 and a substrate 14. The heat sink 15 has an inverted U-shaped cross section thereby forming a recess 160 at the inner bottom and a plurality of pins 151 extending downwardly from the circumferential lower edge of the heat sink 15. The pin 151 is formed with a neck 154, an enlarged head 153, and an open slot 152 separating the enlarged head 153 and the neck 154 into two portions.

The substrate 14 is formed with a plurality of through holes 142 which are positioned and dimensioned to engage with the pins 151 of the heat sink 15. The substrate 14 is provided with a grounding circuit connected with the through holes 142. The substrate 14 is provided with a plurality of metal bumps 12 thereon for supporting the semiconductor chip 11. A layer of thermal conductive bonding agent 13 is applied to the top of the semiconductor chip 11. The heat sink 15 is mounted on the substrate 14, with the pins 151 extending through the through holes 142 and the recess 160 affixed to the top of the semiconductor chip 11 by means of the thermal conductive bonding agent 13. In the meantime, the enlarged heads 153 of the pins 151 are inserted through the holes 142 so that the necks 154 of the pins 151 are engaged with the holes 142 (see FIGS. 3A and 3B).

The heat sink 15 is preferably made of aluminum, copper, or the like so that the heat generated from the semiconductor chip 11 during operation will be carried to the heat sink 15 which will in turn be cooled by air. On the other hand, the heat generated from the semiconductor chip 11 will be carried to the grounding circuit 141 through the holes 142. The grounding circuit 141 is also used for filtering noise and reducing inductance.

Furthermore, as the heat sink 15 is affixed to the substrate 14, the heat sink 15 will provide an excellent pressure control on the semiconductor chip 11 and the distance between the heat sink 15 and the semiconductor chip 11 will be kept at a fixed value thereby ensuring the reliability in the dissipation capability of the present invention.

Figure 4:
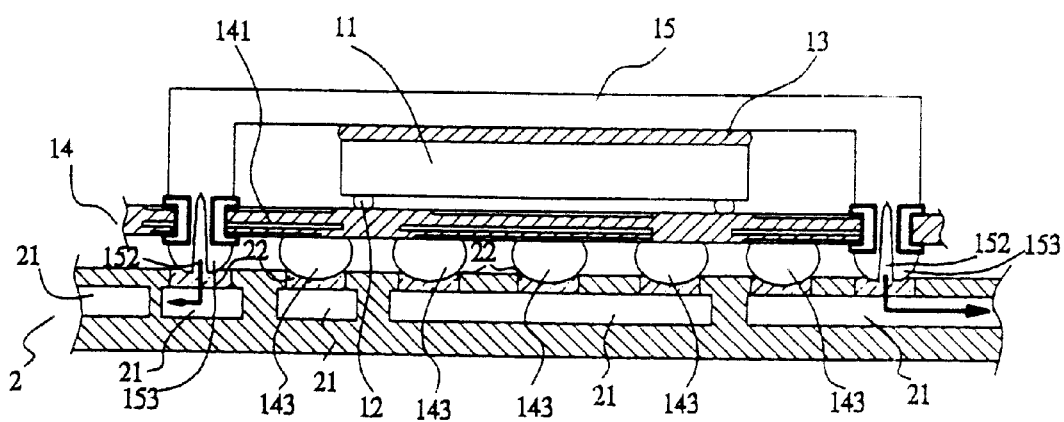
FIG. 4 illustrates the connection between the present invention and the printed circuit board.

As shown in FIG. 4, the semiconductor chip package 1 may be connected with a printed circuit board having an electrical circuit 21 and pads 22 on the top. As illustrated, the tin balls 143 at the bottom of the semiconductor chip package 1 are joined to the pads 22 of the printed circuit board 2 by soldering. Moreover, the enlarged heads 153 of the pins 151 of the heat sink 15 may be joined to the pads 22 of the printed circuit board by soldering so as to strengthen the whole structure and increase dissipation capability.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A semiconductor chip package with cooling arrangement comprising:

a heat sink said heat sink having an inverted U-shaped cross section thereby forming a recess at an inner bottom thereof adapted for covering at least a semiconductor chip and a plurality of pins extending downwardly from a circumferential lower edge of said heat sink, each of said pins being formed with a neck, an enlarged head, and an open slot separating said neck and said enlarged head into two portions; and a substrate formed with a plurality of through holes which engage with said pins of said heat sink, said substrate being provided with a plurality of metal bumps thereon supporting a semiconductor chip, a layer of thermal conductive bonding agent being applied to a top of said semiconductor, said heat sink being mounted on said substrate with said pins extending through said through holes and said recess affixed to said top of said semiconductor chip by means of the thermal conductive bonding agent, said enlarged heads of said pins being inserted through said through holes with said necks of said pins engaged with said through holes, said substrate being provided with a grounding circuit connected with said through holes; and a printed circuit board having an electrical circuit and pads on a top thereof, said substrate having a bottom provided with tin balls joined to said pads of said printed circuit board by soldering, and said enlarged heads of said pins being joined to said pads of said printed circuit board by soldering so as to strengthen whole structure and increase dissipation capability.

* * * * *